United States Patent
Kanoh (10) Patent No.: US 11,169,937 B2
(45) Date of Patent: Nov. 9, 2021

(54) MEMORY CONTROL DEVICE

(71) Applicant: NEC Corporation, Tokyo (JP)

(72) Inventor: Yasushi Kanoh, Tokyo (JP)

(73) Assignee: NEC CORPORTATION, Tokyo (JP)

( * ) Notice: Subject to any disclaimer, the term of this patent is extended or adjusted under 35 U.S.C. 154(b) by 382 days.

(21) Appl. No.: 15/868,071

(22) Filed: Jan. 11, 2018

(65) Prior Publication Data

US 2018/0239720 A1    Aug. 23, 2018

(30) Foreign Application Priority Data

Feb. 20, 2017    (JP) .............................. JP2017-028616

(51) Int. Cl.
| | |
|---|---|
| *G06F 13/36* | (2006.01) |
| *G06F 13/16* | (2006.01) |
| *G06F 3/06* | (2006.01) |
| *G11C 7/00* | (2006.01) |
| *G11C 8/12* | (2006.01) |

(52) U.S. Cl.
CPC ........ *G06F 13/1642* (2013.01); *G06F 3/0611* (2013.01); *G06F 3/0656* (2013.01); *G06F 3/0683* (2013.01); *G06F 13/1673* (2013.01); *G11C 7/00* (2013.01); *G11C 8/12* (2013.01)

(58) Field of Classification Search
CPC .............. G06F 13/1642; G06F 13/1673; G06F 3/0611; G06F 3/0656; G06F 3/0683
USPC ......................................................... 710/310
See application file for complete search history.

(56) References Cited

U.S. PATENT DOCUMENTS

| | | | |
|---|---|---|---|
| 6,170,039 B1 * | 1/2001 | Kishida | G06F 11/1666 711/127 |
| 2006/0179206 A1 * | 8/2006 | Brittain | G06F 13/1647 711/5 |
| 2018/0173649 A1 * | 6/2018 | Kyrychynskyi | G06F 13/161 |

FOREIGN PATENT DOCUMENTS

| | | | |
|---|---|---|---|
| JP | H09-016469 A | | 1/1997 |
| JP | 10333979 A | * | 12/1998 |
| JP | 2001-154913 A | | 6/2001 |
| JP | 3265226 B2 | | 3/2002 |
| JP | 2006-099295 A | | 4/2006 |

OTHER PUBLICATIONS

Japanese Office Action for JP Application No. 2017-028616 dated Oct. 3, 2017 with English Translation.

* cited by examiner

*Primary Examiner* — Chun Kuan Lee
*Assistant Examiner* — Brooke J Taylor (57) ABSTRACT

A memory control device of the present invention controls a memory that includes multiple bank groups each including multiple banks. The memory control device includes a request buffer configured to store memory requests to be issued to the banks, a bank busy manager configured to manage busy states of the banks, a bank group checker configured to, for each of the banks, manage the number of banks in not-busy state of the banks in each of the bank groups, a bank group determination unit configured to determine a bank group to which a memory request is issued, on the basis of the numbers of the banks in not-busy state in the respective bank groups, and a request issuer configured to issue the memory request in the request buffer to a bank in the determined bank group.

15 Claims, 8 Drawing Sheets

MEMORY CONTROL DEVICE

INCORPORATION BY REFERENCE

The present invention is based upon and claims the benefit of priority from Japanese patent application No. 2017-028616, filed on Feb. 20, 2017, the disclosure of which is incorporated herein in its entirety by reference.

TECHNICAL FIELD

The present invention relates to a memory control device and, in particular, to a memory control device that controls a memory including multiple banks.

BACKGROUND ART

Patent Document 1 discloses a bank access control method performed by a synchronous dynamic random access memory (SDRAM), which is a memory including multiple banks. The bank access control method disclosed in Patent Document 1 is described below with reference to a block diagram of FIG. 1.

Figure 1:
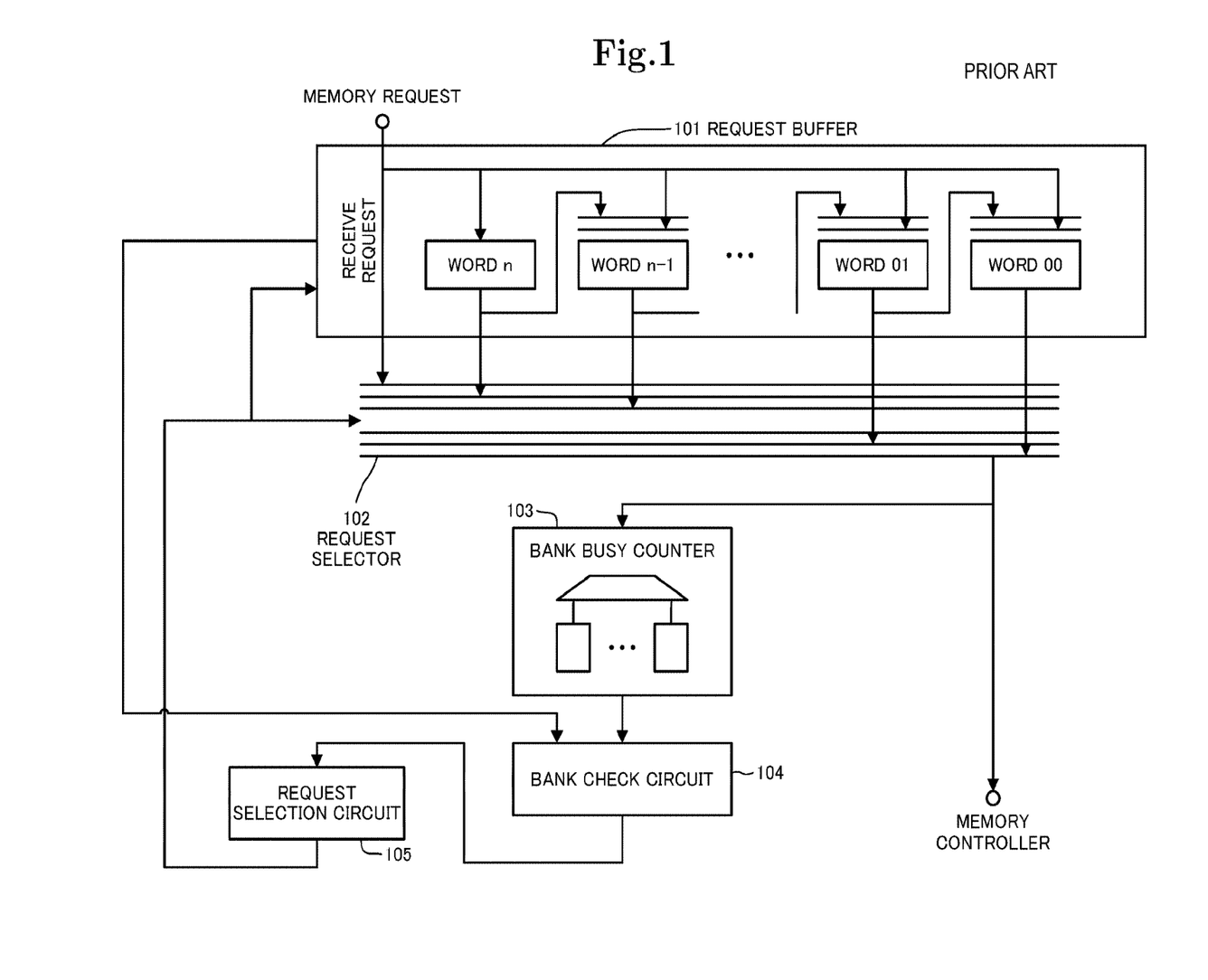
FIG. 1 is a diagram showing the configuration of a bank access control method of the background art.

In the bank access control method shown in FIG. 1, first, a bank check circuit 104 checks a bank to be accessed by a received memory request using a bank busy counter 103. If the bank is not in busy state, the bank check circuit 104 outputs the received request to a memory controller as it is; if the bank is in busy state, it stores the request in a request buffer 101. If multiple requests of the requests in the request buffer 101 get not-busy state at a time, the multiple requests are sequentially transmitted to the memory controller through a request selector 102 in accordance with priorities previously determined by a request selection circuit 105.

Patent Document 2 discloses a memory access control method involving controlling multiple banks by grouping the banks. This memory access control method includes grouping multiple banks into two memory modules, checking the busy states of the banks, and if a bank of in one module get in not-busy state, issuing a request to the bank in the one module so as to overcome a request to a bank in the other module.

Patent Document 1: Japanese Patent No. 3265226
Patent Document 2: Japanese Unexamined Patent Application Publication No. 2006-99295

SUMMARY OF THE INVENTION

SDRAMs conforming to the DDR4 standard have been developed in recent years. A DDR4 SDRAM includes bank groups each including multiple banks that share the same input/output (IO) buffer. For this reason, requests can be continuously issued to banks in different bank groups, but requests cannot be continuously issued to banks in the same bank group, since the banks use the same IO buffer.

Thus, even if the method disclosed in Patent Document 1 is used in a DDR4 SDRAM, there occurs a problem that requests are continuously issued toward banks in the same bank group and wait in a memory controller since the bank groups are not considered, resulting in a reduction in performance.

The method of Patent Document 2 simply divides the main memory into two groups. If one group has a bank in not-busy state, a request is simply issued to the bank in the one group. For this reason, requests are issued without considering the situations of the bank groups and rather simply issued in accordance with the not-busy state of the banks. Thus, even if the method of Patent Document 2 is used in a DDR4 SDRAM, there occurs a problem that requests of two banks in the same bank group are continuously issued to a memory controller and the second request waits in the memory controller, resulting in a reduction in performance.

Accordingly, an object of the present invention is to provide a memory control device that is able to solve the above problem, that is, a reduction in performance due to the wait of issued requests in a memory controller.

A memory control device of one aspect of the present invention is a memory control device for controlling a memory that includes multiple bank groups each including multiple banks. The memory control device includes:

a request buffer configured to store memory requests to be issued to the banks;

a bank busy manager configured to manage busy states of the banks;

a bank group checker configured to, for each of the banks, manage the number of banks in not-busy state in each of the bank groups;

a bank group determination unit configured to determine a bank group to which a memory request is to be issued, on the basis of the numbers of banks in not-busy state in the respective bank groups; and a request issuer configured to issue the memory request in the request buffer to a bank in the determined bank group.

A program of one aspect of the present invention causes a memory control device to implement elements, the memory control device including multiple bank groups each including multiple banks and a request buffer configured to store memory requests to be issued to the banks. The elements are:

a bank busy manager configured to manage busy states of the banks;

a bank group checker configured to, for each of the banks, manage the number of banks in not-busy state in each of the bank groups;

a bank group determination unit configured to determine a bank group to which a memory request is to be issued, on the basis of the numbers of banks in not-busy state in the respective bank groups; and a request issuer configured to issue the memory request in the request buffer to a bank in the determined bank group.

A memory control method of one aspect of the present invention is a memory control method performed by a memory control device that includes multiple bank groups each including multiple banks and a request buffer configured to store memory requests to be issued to the banks. The memory control method includes:

managing busy states of the banks and managing the number of banks in not-busy state in each of the bank groups; determining a bank group to which a memory request is to be issued, on the basis of the numbers banks in not-busy state in the respective bank groups; and issuing the memory request in the request buffer to a bank in the determined bank group.

The present invention thus configured is able to suppress the wait of issued requests in memory controller and thus suppress a reduction in performance.

DETAILED DESCRIPTION

First Embodiment

Figure 6:
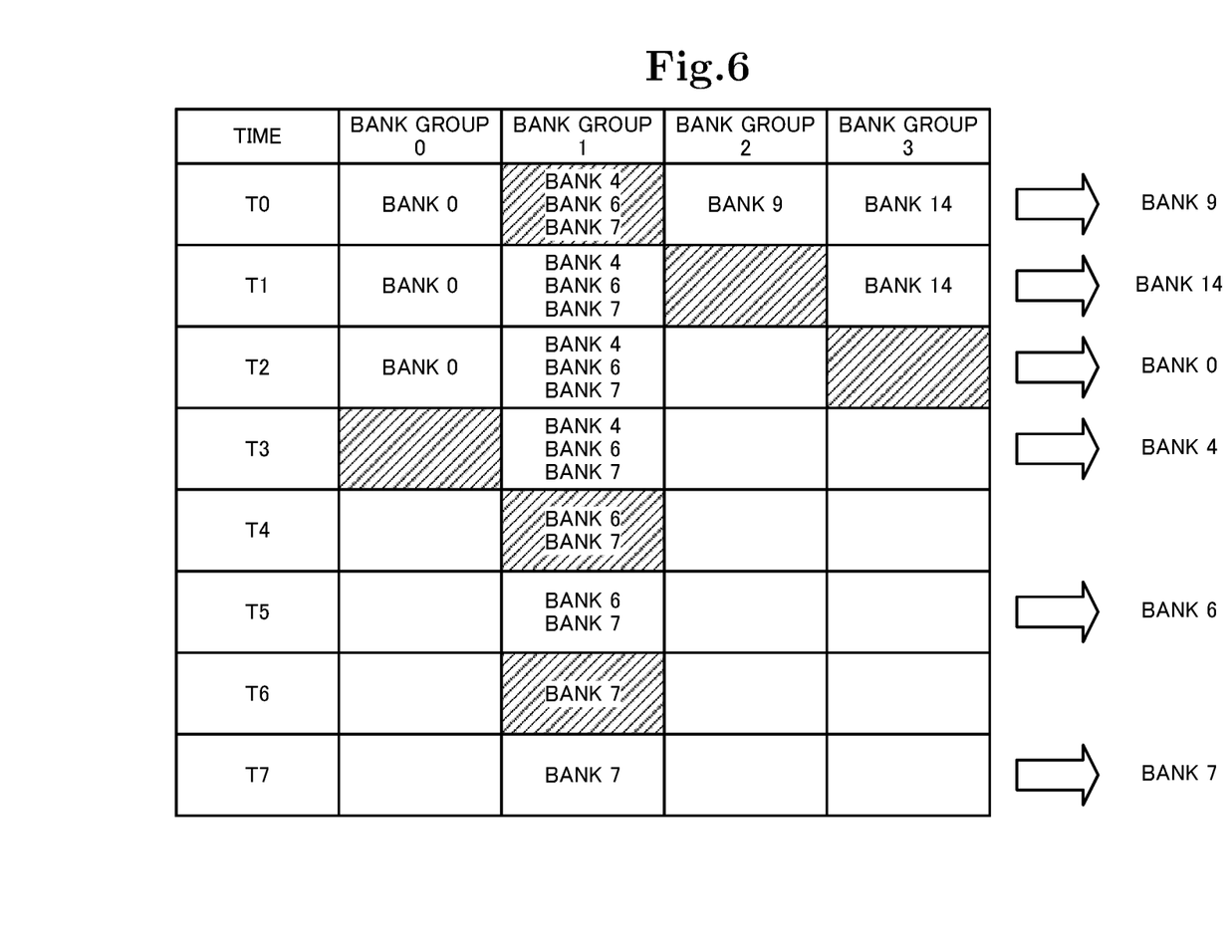
FIG. 6 is a diagram showing effects of the bank group check function of the present invention and showing an aspect in which memory requests are issued when a bank group is selected using simple round-robin.
Figure 7:
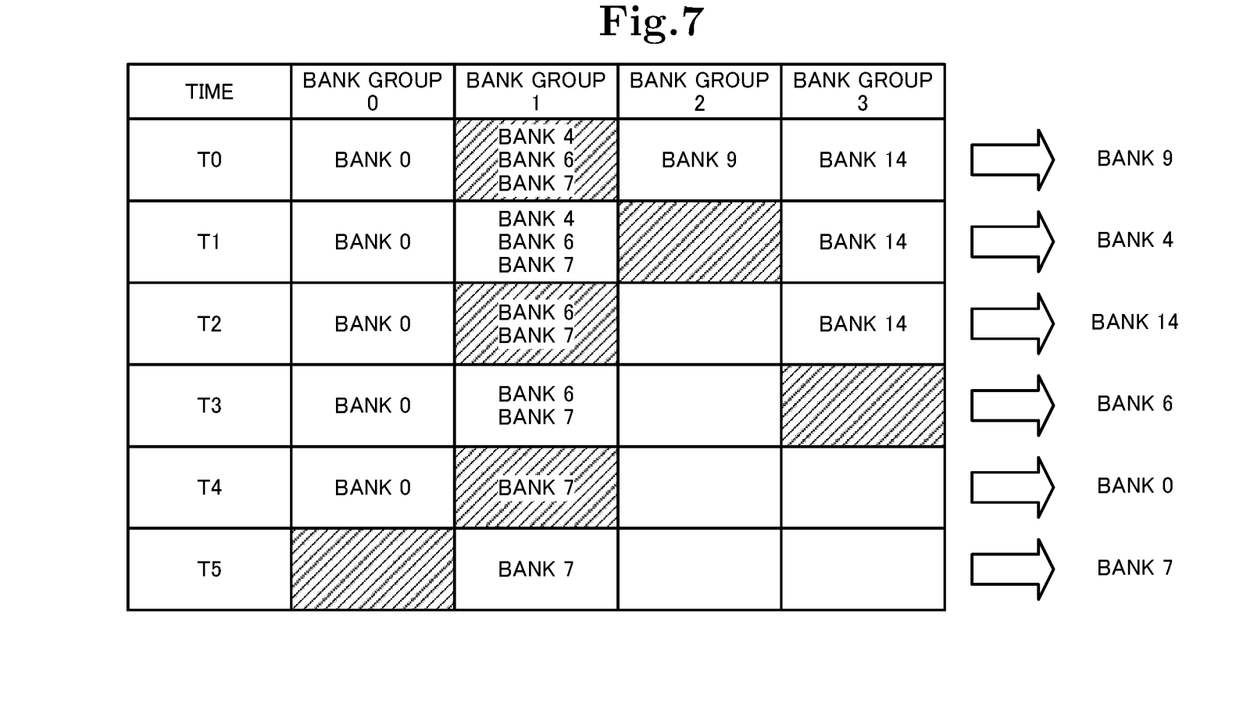
FIG. 7 is a diagram showing effects of the bank group check function of the present invention and showing an aspect in which memory requests are issued when a bank group is selected according to the present invention.

A first embodiment of the present invention will be described with reference to FIGS. 2 to 7. FIGS. 2 to 5 are diagrams showing the configuration of a memory controller of the first embodiment. FIGS. 6 and 7 are diagrams showing the operation of the memory controller.

Configuration

A memory controller of the present invention is a device that controls the access to a memory (main memory) that includes multiple bank groups each including multiple banks.

Figure 2:
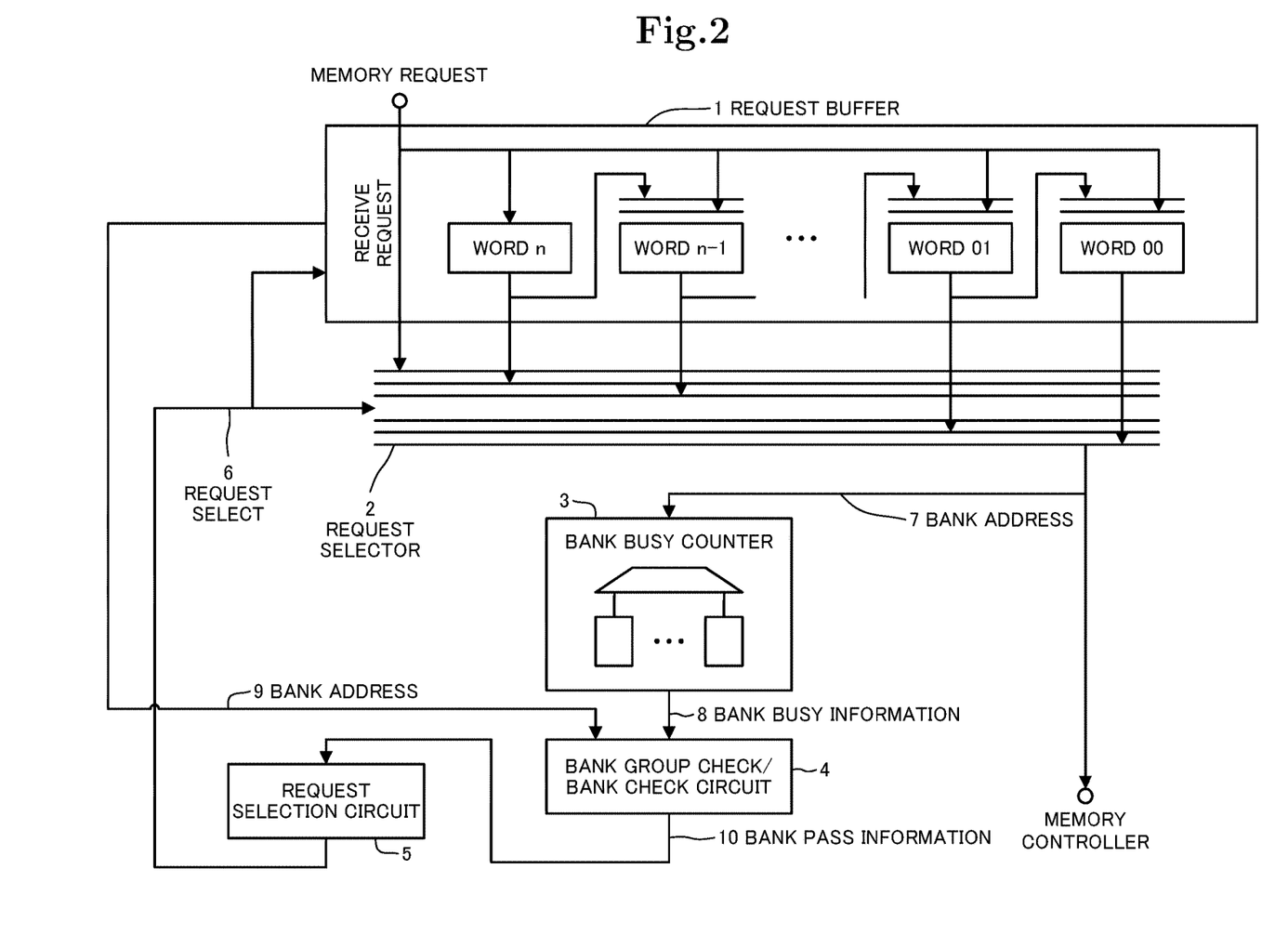
FIG. 2 is a diagram showing the configuration of a memory control device according to a first embodiment of the present invention.

As shown in FIG. 2, the memory control device of the present embodiment includes a request buffer 1, a request selector 2, a bank busy counter 3, a bank group check/bank check circuit 4, and a request selection circuit 5. These elements may be implemented by electric circuits, or may be implemented by incorporating a program into an arithmetic device.

The request buffer 1 stores memory requests (also simply referred to as "requests") to be issued to banks. Specifically, (n+1) number of memory requests are stored in "word 00" to "word n" of the request buffer 1 in the order of reception. A memory request specifies a bank to which the request is issued.

The request selector 2 selects a request in accordance with a request select signal 6 from the request selection circuit 5 and issues the selected request to a memory controller. For example, if two or more of (n+2) number of requests including a receive request satisfy conditions and can be issued, the request selector 2 selects one request having the highest priority in the order of word 00, word 01, word 02, . . . , word n, and receive request and issues the selected request. If a request in "word i" is selected and issued, requests in "word i+1" to "word n" are shifted to "word i" to "word n−1," and the receive request is stored in "word n."

The bank busy counter 3 includes counters corresponding to the banks. A bank address 7 indicating a bank serving as the destination of a request which is issued to the memory controller is transmitted to the bank busy counter 3, and the counter is initialized. The bank busy counter 3 serves as a bank busy manager that manages the busy states of the banks, and the counters are decremented every clock cycle. If a counter corresponding to one bank indicates a non-zero value, the bank busy information 8 of this bank is "1," meaning that the bank is in busy state. If a counter corresponding to one bank indicates a zero value, the bank busy information 8 of this bank is "0," meaning that the bank is in not-busy state.

The bank group check/bank check circuit 4 receives the bank busy information 8 of all the banks from the bank busy counter 3. The bank group check/bank check circuit 4 also receives the bank addresses 9 serving as the destinations of the requests in the request buffer 1. The bank group check/bank check circuit 4 then generates bank pass information 10 indicating which request can be issued next and inputs the bank pass information 10 to the request selection circuit 5. The request selection circuit 5 determines a request to be issued next and generates a request select signal 6.

Figure 3:
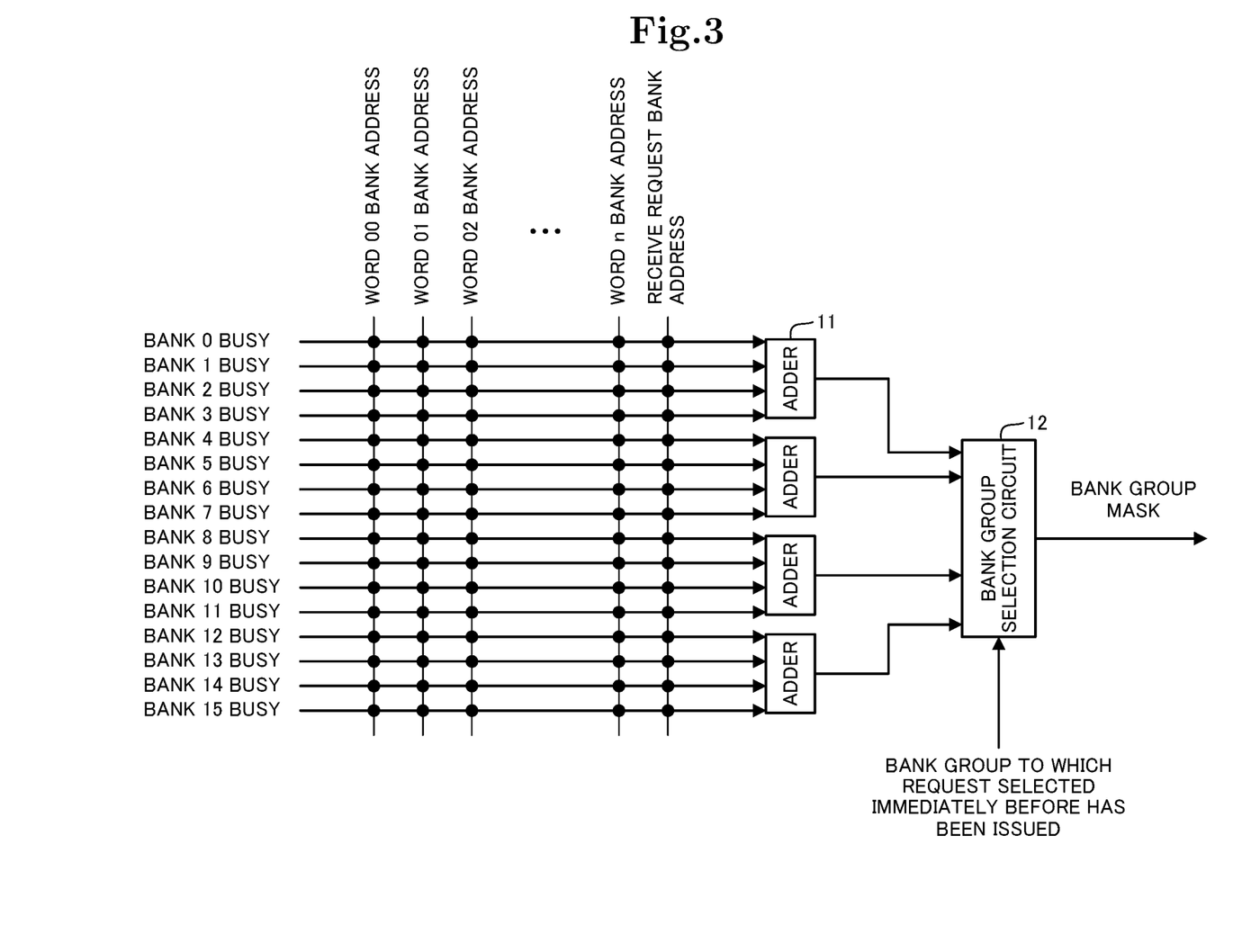
FIG. 3 is a diagram showing the configuration of the bank group check function of a bank group check/bank check circuit shown in FIG. 2.

Referring now to FIG. 3, there will be described a configuration relating to a bank group check function (bank group checker, bank group determination unit) of the bank group check/bank check circuit 4. It is assumed that there are "16" banks, banks 0 to 15, and every four banks form one bank group. Specifically, the banks 0 to 3 form a bank group 0; the banks 4 to 7 form a bank group 1; the banks 8 to 11 form a bank group 2; and the banks 12 to 15 form a bank group 3. Note that the number of banks or the number of bank groups may be any other number.

Bank 0 to 15 busy signals shown in FIG. 3 are signals indicating whether the banks 0 to 15 are in busy state, on the basis of the bank busy information 8 from the bank busy counter 3 in FIG. 2. If a bank i busy signal is "1," the signal indicates that "the bank i is in busy state"; if a bank i busy signal is "0," the signal indicates that "the bank i is in not-busy state." Word 00 to n bank address signals and a receive request bank address signal indicate the bank addresses (banks 0 to 15) serving as the destinations of the requests and receive request in the words 00 to n of the request buffer 1 in FIG. 2.

For example, the bank group check function shown in FIG. 3 operates as follows: if there is a request to be issued to the bank 0 which is indicated by word 00 to n bank address signals and a receive request bank address signal, and if the bank 0 is in not-busy state (that is bank 0 busy signal is "0"), it generates a value of "1"; otherwise, it generates a value of "0"; and then it inputs the generated signal to an adder 11. Similarly, if there are requests to be issued to the banks 1 to 15 which are indicated vy word 00 to n bank address signals and a receive request bank signal, and if the banks 1 to 15 are in not-busy state (that is banks 1 to 15 busy signal is "0"), the bank group check function generates values of "1"; otherwise, it generates values of "0"; and then it inputs the generated signals to adders 11.

The adders 11 are equipped so as to correspond to the bank groups. Each adder 11 adds up information about banks in not-busy state of the corresponding bank group on the basis of the signals inputted as described above. Accordingly, each adder 11 outputs a value of "0 to 4." As seen above, each adder 11 (bank group checker) has a function of managing the number banks in not-busy state in the corresponding bank group.

The values outputted from the adders 11 corresponding to the four bank groups are inputted to a bank group selection circuit 12. Also inputted to the bank group selection circuit 12 is the bank group including a bank to which a request selected immediately before has been issued. The bank group selection circuit 12 (bank group determination unit) selects a bank group whose number (the output of the adder)

of banks in not-busy state having requests is the largest, of the bank groups other than the bank group including the bank selected immediately before. It then outputs a bank group mask signal indicating the selected bank group.

As described above, the bank group selection circuit 12 determines a bank group to which a request is to be issued, on the basis of the numbers of the banks in not-busy state of the bank groups. Note that the bank group selection circuit 12 need not necessarily determine the bank group whose number of banks in not-busy state is the largest, as a bank group to which a request will be issued. For example, the bank group selection circuit 12 may determine a bank group including at least one bank in not-busy state, as a bank group to which a request will be issued.

Also, as described above, the bank group check function shown in FIG. 3 detects the busy states of the banks, that is, detects the busy states of the banks to which the memory requests are to be issued, on the basis of the word 00 to n bank address signal and receive request bank address signal. Note that the bank group check function need not necessarily detect the busy states of the banks to which the memory requests are to be issued. Thus, the bank group selection circuit 12 may determine a bank group in accordance with the numbers of banks in not-busy state of the bank groups.

Figure 4:
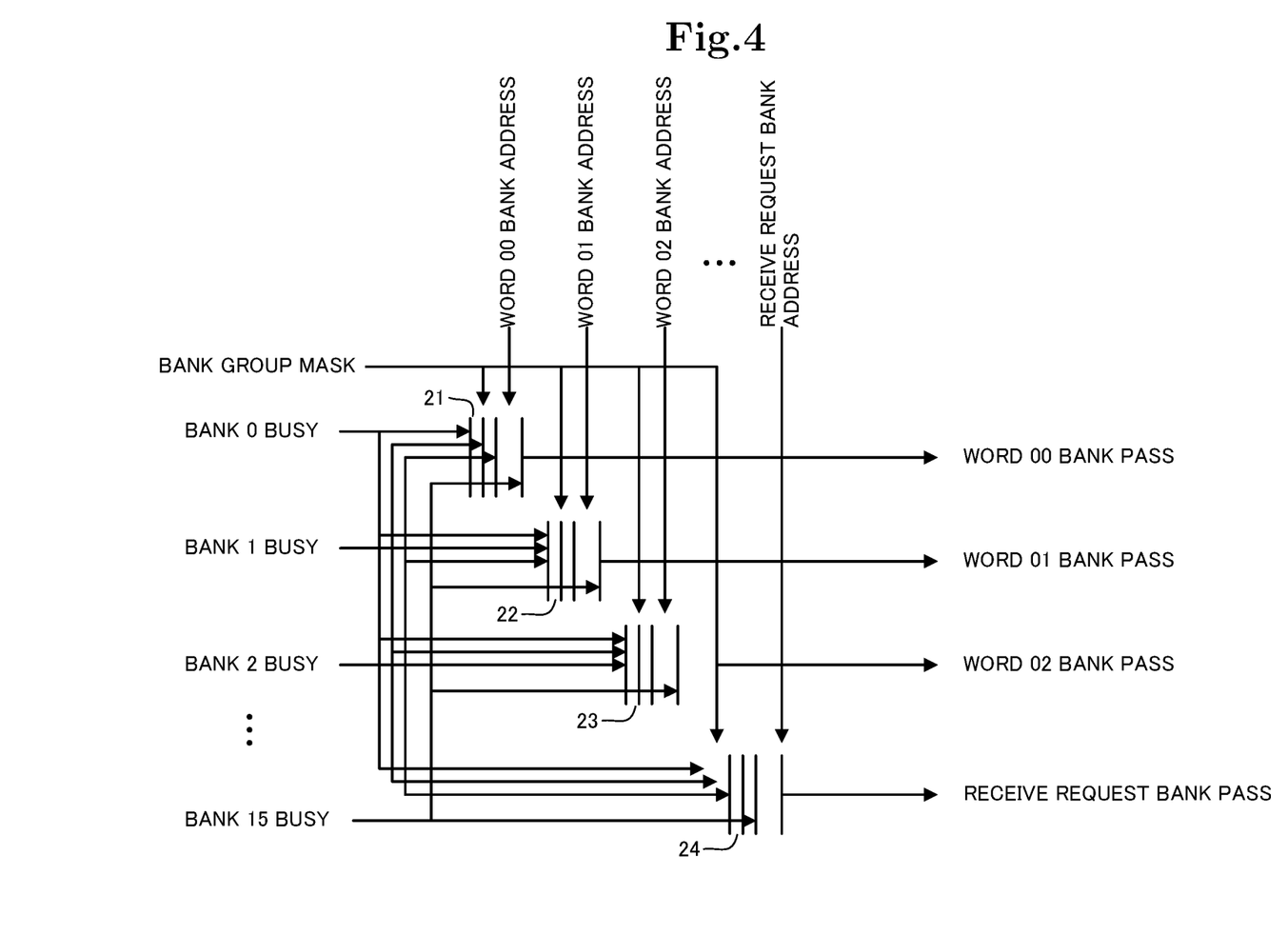
FIG. 4 is a diagram showing the configuration of the bank check function of the bank group check/bank check circuit shown in FIG. 2.

Referring now to FIG. 4, a configuration relating to the bank check function of the bank group check/bank check circuit 4 will be described. The bank check function circuit generates word 00 to n bank pass signals and a receive request bank pass signal on the basis of the bank 0 to 15 busy signals, word 00 to n bank address signals, receive request bank address signal (bank address signal 9), and bank group mask signal.

Specifically, the bank check function circuit sets the word 00 to n bank pass signals and the receive request bank pass signal to "1" when the word 00 to n requests and the receive request have a bank in not-busy state in the bank group which selected by the bank group selection circuit 12, Otherwise the bank check function circuit sets the word 00 to n bank pass signals and the receive request bank pass signal to "0". That is, the bank check function circuit sets the bank pass signals to the banks in not-busy states of the banks in the selected bank group to "1" and outputs bank pass information 10 indicating these passes to the request selection circuit 5.

Figure 5:
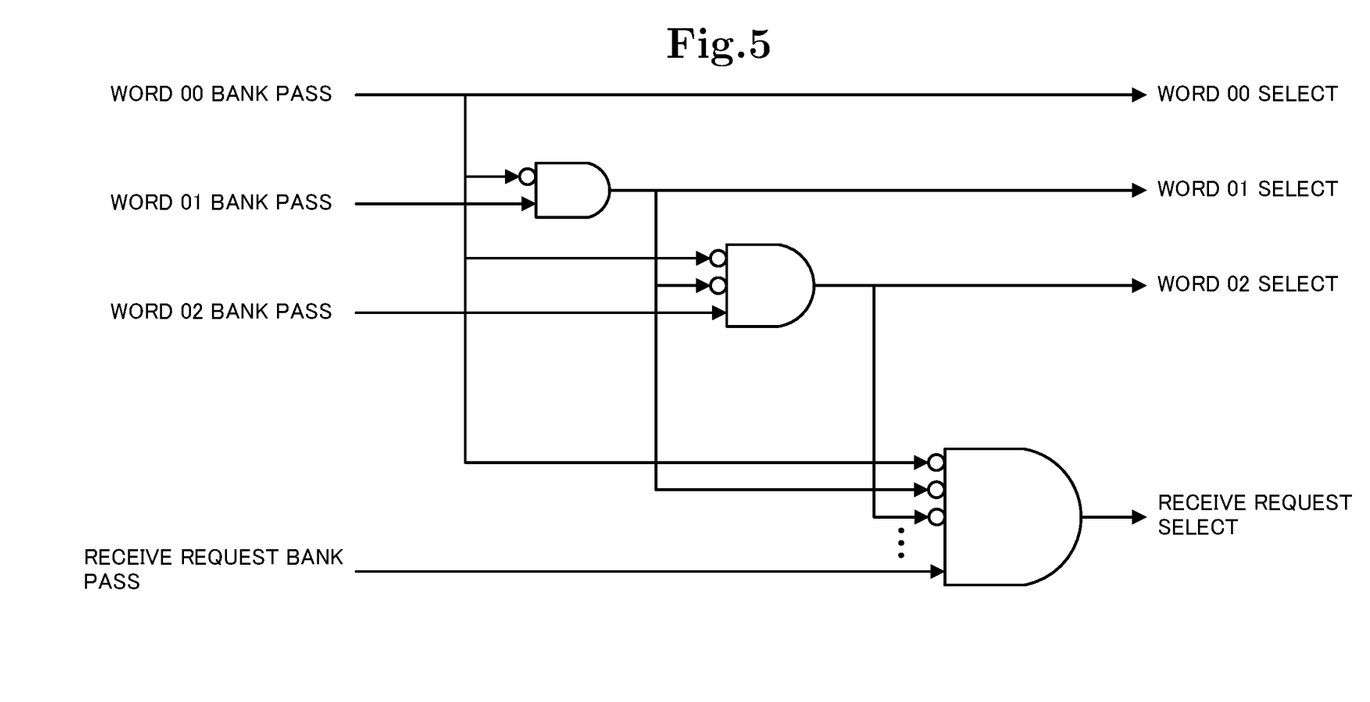
FIG. 5 is a diagram showing the configuration of a request selection circuit shown in FIG. 2.

Referring now to FIG. 5, the request selection circuit 5 will be described. The request selection circuit 5 selects a request having the highest priority, of the requests (word 00 to n requests and receive request) to be issued to the banks set to a value of "1" by the bank check function circuit, of the word 00 to n bank pass signals and the receive request bank pass signal. Of the word 00 to n select signals and the receive request select signal, which are outputs of the request selection circuit 5, the selected select signal alone is set to "1", and the other select signals are set to "0." That is, the selected request which has been set to "1" is a request to be issued and is outputted as a request select signal 6 shown in FIG. 2.

The request selector 2 outputs the request indicated by the request select signal 6 to the memory controller. In this way, the request is issued to a bank in not-busy state in the bank group selected by the bank group selection circuit 12.

As seen above, the bank check function, request selection circuit 5, and request selector 2 serve as a request issuer that issues a request in the request buffer 1 to a bank in a determined bank group. As described above, the request selection circuit 5 selects a request having the highest priority. For example, higher priorities may be assigned to requests that have been stored in the request buffer earlier, and the request selection circuit 5 may select, as a request to be issued, a request that has been stored in the request buffer earliest, of the requests in the request buffer. Note that the method for assigning priorities need not be assigning higher priorities to requests that have been stored in the request buffer earlier and may be any method.

Operation

Next, the operation of the memory control device thus configured will be described with reference to FIGS. 6, 7. In the description, a simple comparative example is used. It will be appreciated that even if the number of banks in not-busy state varies among bank groups, a method of the present invention eliminates the wait of requests issued toward banks in the same bank group.

FIG. 6 shows a case where a bank group is selected using simple round-robin, as a comparative example. FIG. 7 shows a case where a bank group is selected using a method of the present invention. The initial state at time T0 is the same in both FIGS. 6, 7. In the bank group 0, the bank 0 alone is in not-busy state; in the bank group 1, three banks, the bank 4, bank 6, and bank 7, are in not-busy state; in the bank group 2, the bank 9 alone is in not-busy state; and in the bank group 3, the bank 14 alone is in not-busy state.

To simplify the description, it is assumed that any new request is not received and any bank does not newly become in not-busy state.

First, the operation of the comparative example in FIG. 6 will be described. At time T0, a request destination is selected from a bank group other than the bank group 1, since the preceding request destination has been selected from the bank group 1. In other words, any request destination is not selected from the bank group 1. For this reason, in FIG. 6, the cell of the bank group 1 at time T0 is hatched. In this situation, at time T0, the bank 9 in the bank group 2 is selected as a request destination.

Then, at time T1, another request destination is selected from a bank group other than the bank group 2. Since it is assumed that a bank group is selected using round-robin, the bank 14 in the bank group 3 is selected as the other request destination.

Then, at time T2, another request destination is selected from a bank group other than the bank group 3. In this case, the bank 0 in the bank group 0 is selected as the other request destination.

Then, at time T3, another request destination is selected from a bank group other than the bank group 0. In this case, the bank 4 in the bank group 1 is selected as the other request destination.

Then, at time T4, another request destination has to be selected from a bank group other than the bank group 1. However, the bank group 1 alone includes banks that can serve as the other request destination. Accordingly, no bank is selected.

Then, at time T5, the bank 6 in the bank group 1 is selected as the other request destination.

Then, at time T6, another request destination has to be selected from a bank group other than the bank group 1. However, the bank group 1 alone includes a bank that can serve as the other request destination. Accordingly, no bank is selected.

Then, at time T7, the bank 7 in the bank group 1 is selected as the other request destination.

As seen above, the situations where no bank can be selected occur at times T4, T6 in the example of FIG. 6.

Next, the operation using the method of the present invention will be described with reference to FIG. 7. First, at time T0, a request destination is selected from a bank group other than the bank group 1, since the preceding request destination has been selected from the bank group 1. At this time, the bank group check function circuit detects that the numbers of banks in not-busy state in the bank group 0, bank group 2, and bank group 3 are (1, 1, 1), that is, the numbers are the same, selects the bank group 2 from these bank groups, and selects the bank 9 as a request destination.

Note that if the numbers of banks in not-busy state are the same as described above, for example, a bank group next to a bank group to which the preceding request has been issued may be selected, or another bank group may be selected using any other method.

Then, at time T1, another request destination is selected from a bank group other than the bank group 2. The numbers of banks in not-busy state in the bank group 0, bank group 1, and bank group 3 are (1, 3, 1). The bank group 1, which includes the largest number (3) of banks in not-busy state, is selected from these bank groups, and the bank 4 is selected as the other request destination.

Then, at time T2, another request destination is selected from a bank group other than the bank group 1. The numbers of banks in not-busy state in the bank group 0, bank group 2, and bank group 3 are (1, 0, 1). The bank group 3 is selected from these bank groups, and the bank 14 is selected as the other request destination.

Then, at time T3, another request destination is selected from a bank group other than the bank group 3. The numbers of banks in not-busy state in the bank group 0, bank group 1, and bank group 2 are (1, 2, 0). The bank group 1, which includes the largest number (2) of banks in not-busy state, is selected from these bank groups, and the bank 6 is selected as the other request destination.

Then, at time T4, another request destination is selected from a bank group other than the bank group 1. The numbers of banks in not-busy state in the bank group 0, bank group 2, and bank group 3 are (1, 0, 0). The bank group 0, which includes the largest number (1) of banks in not-busy state, is selected from these bank groups, and the bank 0 is selected as the other request destination.

Then, at time T5, another request destination is selected from a bank group other than the bank group 0. The numbers of banks in not-busy state in the bank group 1, bank group 2, and bank group 3 are (1, 0, 0). Accordingly, the bank group 1, which includes the largest number (1) of banks in not-busy state, is selected from these bank groups, and the bank 7 is selected as the other request destination.

As seen above, the method of the present invention described with reference to FIG. 7 is able to process the requests two clocks faster than the method of selecting a bank group from the selectable bank groups simply using round-robin shown in FIG. 6. That is, in the example of FIG. 6, two waits occur so that banks in the same bank group are prevented from being continuously selected as request destinations; in the example of FIG. 7, such two waits can be eliminated, resulting in an increase in performance.

As described above, according to the present invention, a bank group is selected on the basis of the numbers of banks in not-busy state, and a request is issued to a bank in the selected bank group. More specifically, there is selected a bank group which differs from a bank group including a bank to which a request has been issued immediately before and which includes the largest number of banks in not-busy state. Thus, it is possible to eliminate waits for preventing banks in the same bank group from being continuously selected as request destinations. Even if the number of banks in not-busy state varies among bank groups, banks in different bank groups can be selected as request destinations, suppressing a reduction in performance.

Second Embodiment

Figure 8:
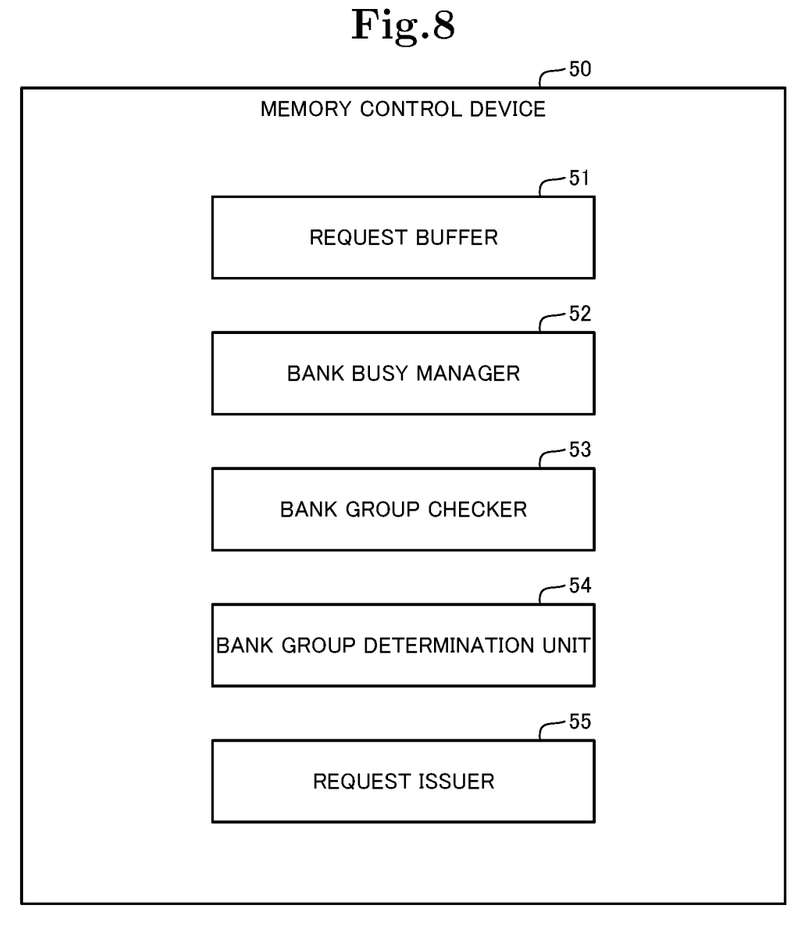
FIG. 8 is a block diagram showing the configuration of a memory control device according to a second embodiment of the present invention.

Next, a second embodiment of the present invention will be described with reference to FIG. 8. FIG. 8 is a block diagram showing the configuration of a memory control device according to the second embodiment. The memory control device of the present embodiment represents an outline of the configuration of the memory control device described in the first embodiment.

As shown in FIG. 8, a memory control device 50 of the present embodiment is a memory control device 50 for controlling a memory that includes multiple bank groups each including multiple banks. The memory control device 50 includes:

a request buffer 51 configured to store memory requests to be issued to the banks;

a bank busy manager 52 configured to manage busy states of the banks;

a bank group checker 53 configured to manage the number of banks in not-busy state of the banks in each of the bank groups;

a bank group determination unit 54 configured to determine a bank group to which a memory request is to be issued, on the basis of the numbers of the banks in not-busy state in the bank groups; and a request issuer 55 configured to issue the memory request in the request buffer to a bank in the determined bank group.

The bank busy manager 52, bank group checker 53, bank group determination unit 54, and request issuer 55 may be constructed by causing an arithmetic device included in the memory control device 50 to execute a program.

The memory control device 50 thus configured first manages busy states of the banks and manages the number of banks in not-busy state of the banks in each of the bank groups. The memory control device 50 then determine a bank group to which a memory request is to be issued, on the basis of the numbers of the banks in not-busy state in the bank groups and issues the memory request in the request buffer to a bank in the determined bank group.

As described above, according to the present invention, a bank group is selected on the basis of the numbers of banks in not-busy state, and a request is issued to a bank in the selected bank group. Thus, a bank group to which a request is to be issued is selected anytime. As a result, it is possible to eliminate waits for preventing banks in the same bank group from being continuously selected as request destinations and thus to suppress a reduction in performance.

Supplementary Notes

Some or all of the above embodiments can be described as described in Supplementary Notes below. The configurations of a memory control device, program, and memory control method of the present invention are outlined below. However, the present invention is not limited to the configurations below.

Supplementary Note 1

A memory control device for controlling a memory that includes a plurality of bank groups each including a plurality of banks, the memory control device comprising:

a request buffer configured to store memory requests to be issued to the banks;

a bank busy manager configured to manage busy states of the banks;

a bank group checker configured to, for each of the banks, manage the number of banks in not-busy state of the banks in each of the bank groups;

a bank group determination unit configured to determine a bank group to which a memory request is to be issued, on the basis of the numbers of the banks in not-busy state in the respective bank groups; and a request issuer configured to issue the memory request in the request buffer to a bank in the determined bank group.

Supplementary Note 2

The memory control device according to Supplementary Note 1, wherein the bank group determination unit determines a bank group that includes the largest number of banks in not-busy state, as the bank group to which the memory request is to be issued.

Supplementary Note 3

The memory control device according to Supplementary Note 1 or 2, wherein the bank group determination unit determines a bank group that includes the largest number of banks in not-busy state among the banks to which the memory requests are to be issued, as the bank group to which the memory request is to be issued.

Supplementary Note 4

The memory control device according to any one of Supplementary Notes 1 to 3, wherein the bank group determination unit determines a bank group different from a bank group to which a memory request has been issued immediately before, as the bank group to which the memory request is to be issued.

Supplementary Note 5

The memory control device according to any one of Supplementary Notes 1 to 4, wherein the request issuer issues the memory request in the request buffer to a bank in not-busy state in the determined bank group.

Supplementary Note 6

The memory control device according to any one of Supplementary Notes 1 to 5, wherein the request issuer issues a memory request that has been stored in the request buffer earliest, of the memory requests in the request buffer.

Supplementary Note 7

A non-transitory computer-readable storage medium storing a program for causing a memory control device to implement elements, the memory control device including a plurality of bank groups each including a plurality of banks and a request buffer configured to store memory requests to be issued to the banks, the elements being:

a bank busy manager configured to manage busy states of the banks;

a bank group checker configured to, for each of the banks, manage the number of banks in not-busy state of the banks in each of the bank groups;

a bank group determination unit configured to determine a bank group to which a memory request is to be issued, on the basis of the numbers of the banks in not-busy state in the respective bank groups; and a request issuer configured to issue the memory request in the request buffer to a bank in the determined bank group.

Supplementary Note 8

The computer-readable storage medium storing the program according to Supplementary Note 7, wherein the bank group determination unit determines a bank group that includes the largest number of banks in not-busy state, as the bank group to which the memory request is to be issued.

Supplementary Note 9

The computer-readable storage medium storing the program according to Supplementary Note 7 or 8, wherein the bank group determination unit determines a bank group that includes the largest number of banks in not-busy state among the banks to which the memory requests are to be issued, as the bank group to which the memory request is to be issued.

Supplementary Note 10

The computer-readable storage medium storing the program according to any one of Supplementary Notes 7 to 9, wherein the bank group determination unit determines a bank group different from a bank group to which a memory request has been issued immediately before, as the bank group to which the memory request is to be issued.

Supplementary Note 11

The computer-readable storage medium storing the program according to any one of Supplementary Notes 7 to 10, wherein the request issuer issues the memory request in the request buffer to a bank in not-busy state in the determined bank group.

Supplementary Note 12

The computer-readable storage medium storing the program according to any one of Supplementary Notes 7 to 11, wherein the request issuer issues a memory request that has been stored in the request buffer earliest, of the memory requests in the request buffer.

Supplementary Note 13

A memory control method performed by a memory control device that includes a plurality of bank groups each including a plurality of banks and a request buffer configured to store memory requests to be issued to the banks, the memory control method comprising:

managing busy states of the banks and managing the number of banks in not-busy state of the banks in each of the bank groups; determining a bank group to which a memory request is to be issued, on the basis of the numbers of the banks in not-busy state in the respective bank groups; and issuing the memory request in the request buffer to a bank in the determined bank group.

Supplementary Note 14

The memory control method according to Supplementary Note 13, wherein a bank group that includes the largest number of banks in not-busy state is determined as the bank group to which the memory request is to be issued.

Supplementary Note 15

The memory control method according to Supplementary Note 13 or 14, wherein a bank group that includes the largest number of banks in not-busy state among the banks to which the memory requests are to be issued is determined as the bank group to which the memory request is to be issued.

Supplementary Note 16

The memory control method according to any one of Supplementary Notes 13 to 15, wherein a bank group different from a bank group to which a memory request has been issued immediately before is determined as the bank group to which the memory request is to be issued.

Supplementary Note 17

The memory control method according to any one of Supplementary Notes 13 to 16, wherein the memory request in the request buffer is issued to a bank in not-busy state in the determined bank group.

Supplementary Note 18

The memory control method according to any one of Supplementary Notes 13 to 17, wherein a memory request that has been stored in the request buffer earliest, of the memory requests in the request buffer is issued.

The above program is stored in a storage device or computer-readable storage medium. For example, the storage medium is a portable medium such as a flexible disk, optical disk, magneto-optical disk, or semiconductor memory.

While the present invention has been described with reference to the embodiments and the like, the present invention is not limited thereto. Various changes understandable by those skilled in the art can be made to the configuration or details of the present invention without departing from the scope of the invention.

DESCRIPTION OF REFERENCE NUMERALS 1 request buffer
2 request selector
3 bank busy counter
4 bank group check/bank check circuit
5 request selection circuit
11 adder
12 bank group selection circuit
50 memory control device
51 request buffer
52 bank busy manager
53 bank group checker
54 bank group determination unit
55 request issuer

The invention claimed is:

1. A memory control device for controlling a memory that includes a plurality of bank groups, each of the plurality of the bank groups including a plurality of banks, the memory control device comprising:
   a request buffer configured to store memory requests to be issued to the plurality of banks;
   a bank busy manager configured to manage busy states of the plurality of banks;
   a bank group checker configured to, for each of the plurality of banks, manage the number of banks in not-busy state of the plurality of banks in each of the plurality of bank groups;
   a bank group determination unit configured to determine a bank group to which a memory request is to be issued among the plurality of the bank groups, on the basis of the numbers of banks in not-busy banks in each of the plurality of bank groups; and
   a request issuer configured to issue the memory request in the request buffer to a bank in the not-busy state in the determined bank group including the plurality of the banks, wherein
   the bank group determination unit determines a bank group that includes the largest number of banks in the not-busy state, as the bank group to which the memory request is to be issued.

2. The memory control device according to claim 1, wherein the bank group determination unit determines a bank group that includes the largest number of banks in not-busy state among the plurality of banks to which the memory requests are to be issued, as the bank group to which the memory request is to be issued.

3. The memory control device according to claim 1, wherein the bank group determination unit determines a bank group different from a bank group to which a memory request has been issued immediately before, as the bank group to which the memory request is to be issued.

4. The memory control device according to claim 1, wherein the request issuer issues the memory request in the request buffer to a bank in not-busy state in the determined bank group.

5. The memory control device according to claim 1, wherein the request issuer issues a memory request that has been stored in the request buffer earliest, of the memory requests in the request buffer.

6. A non-transitory computer-readable storage medium storing a program for causing a memory control device to implement elements, the memory control device including a plurality of bank groups each including a plurality of banks and a request buffer configured to store memory requests to be issued to the plurality of banks, the elements being:
   a bank busy manager configured to manage busy states of the plurality of banks;
   a bank group checker configured to, for each of the plurality of banks, manage the number of banks in not-busy state of the plurality of banks in each of the plurality of bank groups;
   a bank group determination unit configured to determine a bank group to which a memory request is to be issued, on the basis of the numbers of banks in not-busy banks in each of the plurality of bank groups; and
   a request issuer configured to issue the memory request in the request buffer to a bank in the determined bank group, wherein
   the bank group determination unit determines a bank group that includes the largest number of banks in the not-busy state, as the bank group to which the memory request is to be issued.

7. The computer-readable storage medium storing the program according to claim 6, wherein the bank group determination unit determines a bank group that includes the largest number of banks in not-busy state among the plurality of banks to which the memory requests are to be issued, as the bank group to which the memory request is to be issued.

8. The computer-readable storage medium storing the program according to claim 6, wherein the bank group determination unit determines a bank group different from a bank group to which a memory request has been issued immediately before, as the bank group to which the memory request is to be issued.

9. The computer-readable storage medium storing the program according to claim 6, wherein the request issuer issues the memory request in the request buffer to a bank in not-busy state in the determined bank group.

10. The computer-readable storage medium storing the program according to claim 6, wherein the request issuer issues a memory request that has been stored in the request buffer earliest, of the memory requests in the request buffer.

11. A memory control method performed by a memory control device that includes a plurality of bank groups each including a plurality of banks and a request buffer configured to store memory requests to be issued to the plurality of banks, the memory control method comprising:
   managing busy states of the plurality of banks and managing the number of banks in not-busy state of the plurality of banks in each of the plurality of bank groups;
   determining a bank group to which a memory request is to be issued, on the basis of the numbers of banks in not-busy state in each of the respective plurality of bank groups; and
   issuing the memory request in the request buffer to a bank in the determined bank group, wherein
   a bank group that includes the largest number of banks in the not-busy state is determined as the bank group to which the memory request is to be issued.

12. The memory control method according to claim 11, wherein a bank group that includes the largest number of banks in not-busy state among the plurality of banks to which the memory requests are to be issued is determined as the bank group to which the memory request is to be issued.

13. The memory control method according to claim 11, wherein a bank group different from a bank group to which a memory request has been issued immediately before is determined as the bank group to which the memory request is to be issued.

14. The memory control method according to claim 11, wherein the memory request in the request buffer is issued to a bank in not-busy state in the determined bank group.

15. The memory control method according to claim 11, wherein a memory request that has been stored in the request buffer earliest, of the memory requests in the request buffer is issued.

\* \* \* \* \*